INVENTORS
PETER C. NEWMAN
ANDREW F. BEER
BY
Frank R. Jifari
AGENT

INVENTORS
PETER C. NEWMAN
ANDREW F. BEER
BY
Frank R. Trifari
AGENT

United States Patent Office 3,508,126
Patented Apr. 21, 1970

3,508,126

SEMICONDUCTOR PHOTODIODE WITH P-N JUNCTION SPACED FROM HETEROJUNCTION

Peter Colin Newman and Andrew Francis Beer, Crawley, England, assignors, by mesne assignments, to U.S. Philips Corporation, New York, N.Y., a corporation of Delaware Continuation of application Ser. No. 480,344, Aug. 17, 1965. This application July 18, 1968, Ser. No. 750,997
Claims priority, application Great Britain, Aug. 19, 1964, 33,876/64; Apr. 7, 1965, 14,739/65
Int. Cl. H01l 15/00
U.S. Cl. 317—235 8 Claims

ABSTRACT OF THE DISCLOSURE

A semiconductor photodiode having a heterojunction between portions of different bandgaps and a p-n junction between regions of opposite conductivity type. The p-n junction is located wholly within the smaller bandgap portion spaced from the heterojunction such that the depletion region lies in the smaller bandgap portion of smaller absorption length. The radiation received is impinged on the larger bandgap portion and passes through same to become absorbed in the smaller bandgap portion within or near the depletion region.

This application is a continuation of S.N. 480,344, filed Aug. 17, 1965 (now abandoned).

This invention relates to photo-electric semiconductor diodes, for example, photo-diode radiation detectors for detecting narrow band radiation and photo-diode detectors for collecting broad band radiation such as solar cells, comprising a semiconductor body having a heterojunction between a first portion of a first semiconductor material and a second portion of a second semiconductor material of lower energy gap than the first semiconductor material. The invention further relates to methods of manufacturing such photo-electric semiconductor diodes.

In the operation of a photo-diode comprising a semiconductor body having a p-n- junction with electrodes on each side of the junction, the radiation to be detected is arranged to be incident on the semiconductor body near the p-n junction, usually within a distance therefrom of a few diffusion lengths of the free charge carriers in the semiconductor body. The photo-diode may be operated as occurs in photo-diode solar cells such that the radiation produces an electric voltage at the electrodes and/or an electric current in an external circuit between the electrodes. The photo-diode may be operated such as occurs in photo-diode radiation detectors by applying a reverse voltage to the p-n junction between the electrodes, the current produced in an external circuit between the electrodes by the radiation being a measure of the radiation.

In both cases the operation is such that photons are absorbed in the semiconductor body with the generation of electron-hole pairs. Electron-hole pairs which are generated in the depletion region of the junction or within a diffusion length of the depletion region are rapidly separated by the electric field at the junction and contribute to the output current. It is therefore desirable that absorption of the incident radiation shall occur in the body within the depletion region of the p-n junction or within a carrier diffusion length of the depletion region.

The absorption length of photons of the incident radiation is dependent, inter alia, upon the energy gap of the semiconductor material and, for a given wavelength, generally increases with increasing energy gap of the semiconductor material. The absorption length L is defined by the equation $I(x)=I(o)\exp(-x/L)$, which holds within the material for plane radiation of a given wavelength. Here $I(o)$=Light intensity at a reference plane
$x$=Distance from reference plane
$I(x)$=Light intensity at $x$.

A photo-diode comprising a semiconductor body having a p-n juncton in a single semiconductor material is hereinafter referred to as a homojunction photo-diode. In a homojunction photodiode with the p-n junction located within a few carrier diffusion lengths of the illuminated surface, quite a high conversion efficiency of an external light flux may be obtained, but the diode will respond to a wide spectrum of radiation having quantum energies lying largely above the energy gap of the semiconductor material. In homojunction photo-diodes in which the junction is situated progressively further away from the illuminated surface, the photo-diode will respond to a progressively narrow spectrum of radiation, with a progressively decreasing efficiency.

This disadvantage has been overcome to a certain extent in a photo-diode comprising a heterojunction between two semiconductor material have differing energy gaps. Thus a known photo-diode comprises a p-n heterojunction between a first portion of a first semiconductor material, for example of p-type gallium arsenide, and a second portion of a second semiconductor material of lower energy gap than the first material, for example of n-type germanium. The sceond semiconductor material is chosen in accordance with the energy value of the radiation to be detected and such that the absorption length of the photons of the incident radiation is low in the material. The semiconductor material of the first portion is chosen such that the energy gap is greater than the energy value of the radiation to be detected and such that the absorption length of this radiation is high in the material. The first portion of semiconductor material of higher energy gap thus acts as an effective window for the radiation to be detected and the necessity of locating the p-n junction very close to the surface on which the radiation is incident is at least partly obviated.

In such a heterojunction photo-diode in which the p-n junction is at the interface of the two semiconductor materials the depletion region of the junction will extend into both materials but the part of the depletion region located in the higher energy gap material will not contribute appreciably to the absorption nor hence to the output. Furthermore if the heterojunction is formed by vapour deposition of one semiconductor material on a substrate of the other semiconductor material, the interface may be of poor quality such that the junction properties are adversely affected.

According to a first aspect of the invention a photoelectric semiconductor diode comprises a semiconductor body having a heterojunction between a first portion of a first semiconductor material and a second portion of a second semiconductor material of lower energy gap than the first semiconductor material, a first region of the body of one conductivity type (p or n) lying predominantly within the first portion and a second region of the body of the opposite conductivity type (n or p) lying wholly within the second portion with the p-n junction between the first and second regions lying in the second portion spaced from the heterojunction by a distance such that in operation the depletion region of the junction lies substantially wholly within the second portion of the body.

The advantages of such a photo-diode resides in that with the p-n junction lying in the second portion of the body consisting of semiconductor material of lower energy gap and the depletion region of the p-n junction lying substantially wholly in the second portion, the available depletion layer width in which significant absorption occurs and contributes towards the output is increased which leads to more efficient absorption and hence increased output. Furthermore in a heterojunction photo-diode in which the impurity concentration is higher in the semiconductor material of higher energy gap than the impurity concentration in the semiconductor material of lower energy gap, as the width of the depletion region is dependent, inter alia, on the impurity concentration and decreases with increasing impurity concentrations, the effective width of the depletion layer is further increased when the p-n junction is spaced from the heterojunction and lies in the lower energy gap material. Furthermore, the region of high field is removed from the heterojunction interface which if it is of poor quality may lead to breakdown at considerably lower reverse bias voltage than would be normally expected.

The higher efficiency which can be obtained in this way may be applied to the detection of radiation with a broad or narrow spectrum, by suitably choosing the energy gaps of the first and second semiconductor materials.

The p-n junction may be spaced from the heterojunction by a distance of at least 1 micron, or may be greater than 2 microns, or even may be greater than 3 microns. The optimum spacing of the heterojunction and the p-n junction will depend, inter alia, on the impurity concentrations in the vicinity of the heterojunction and the p-n junction. Ideally in normal operation there should be no part of the second portion of the semiconductor body located between the p-n junction and the heterojunction in which the depletion region is not present.

Consequently, in a preferred embodiment of the photoelectric semiconductor diode according to the invention the p-n junction is spaced from the heterojunction by a distance within reach of the depletion layer of the p-n junction under a reverse voltage. This means, that it is possible to apply a reverse bias to the p-n junction such that the depletion layer reaches the heterojunction without danger of entering the avalanche breakdown region of said junction.

In a further preferred embodiment of the photoelectric semiconductor diode the p-n junction is spaced from the heterojunction by a distance such that under operating conditions the depletion layer of the p-n junction extends practically to the heterojunction. In this embodiment, therefore, the reverse voltage which is applied to the p-n junction in operating condition is such that the edge of the depletion layer practically coincides with the heterojunction.

In order to collect most of the incident light the highly absorbing part of the depletion layer of the p-n junction should have a width greater than three absorption lengths of the main maximum of the incident wavelengths. It was calculated, that at three absorption lengths already 95%, at 4 absorption lengths 98% and at 5 absorption lengths 99.4% of the collected photons are absorbed. A greater width of the depletion layer might lead to increase of transit time for the hole-electron pairs.

Accordingly, in another preferred embodiment of the photoelectric semiconductor diode the doping of the material with the lower energy gap and the reverse voltage over the p-n junction are so chosen, that the width of the depletion layer is greater than about three absorption lengths of the main maximum of the incident light.

In a further preferred embodiment of the photoelectric semiconductor diode the doping of the material with the lower energy gap and the reverse voltage over the p-n junction are so chosen, that the width of the depletion layer is not greater than about five absorption lengths of the main maximum of the incident light.

The first portion of the semiconductor body may be epitaxial with the second portion of the semiconductor body.

The first portion of the body may consist of a first semiconductor material epitaxially deposited on the second portion consisting of a second semiconductor material of lower energy gap than the first semiconductor material.

The first semiconductor material of the first portion may be, for example, a III–V semiconductor compound or a substituted III–V semiconductor compound and the second semiconductor material of the second portion may be, for example, a III–V semiconductor compound or substituted III–V semiconductor compound.

Reference to a III–V semiconductor compound is to be understood to mean a compound between substantially equal atomic amounts of an element of the class consisting of boron, aluminum, gallium and indium of Group III of the Periodic Table and an element of the class consisting of nitrogen, phosphorus, arsenic and antimony of Group V of the Periodic Table. Reference to a substituted III–V semiconductor compound is to be understood to mean a III–V semiconductor compound in which some of the atoms of the element of the above class of Group III are replaced by atoms of another element or other elements of the same class and/or some of the atoms of the element of the above class of Group V are replaced by atoms of another element or other elements of the same class.

The first portion may be of gallium arseno-phosphide and the second portion may be of gallium arsenide.

In one form of a photo-diode according to the invention the location of the p-n junction spaced from the heterojunction has been determined by the diffusion in the vicinity of the heterojunction of a conductivity type determining impurity element characteristic of the one type, initially present in the first portion in a substantially uniform concentration, from the first portion into the second portion initially containing a substantially uniform concentration of a conductivity type determining impurity element characteristic of the opposite type and lower than the concentration of the impurity element of the one type in the first portion.

Thus in one such device the heterojunction is between a first portion of n-type gallium arseno-phosphide initially containing a substantially uniform concentration of a donor element expitaxially deposited on a second portion of gallium arsenide initially containing a substantially uniform concentration of an acceptor element lower than the concentration of the donor element in the first portion and the p-n junction has been located in the second portion spaced from the heterojunction by the diffusion of the donor element in the vicinity of the heterojunction from the first portion into the second portion. In this device the donor element may be tin and the acceptor element may be zinc.

In a further form of a photo-diode according to the first aspect of the invention the heterojunction is between a first portion of a first material containing a substantially uniform concentration of a conductivity type determining impurity element characteristic of the opposite type and a second portion of a second material of lower energy gap than the material of the first portion and of lower resistivity containing a substantially uniform concentration of a conductivity type determining impurity element characteristic of the opposite type higher than the concentration of the conductivity type deermining impurity element characteristic of the opposite type in the first portion, the concentration change in conductivity type determining impurity element characteristic of the opposite type in the vicinity of the heterojunction from the first portion to the second portion being gradual, and the location of the p-n junction spaced from the heterojunction in the second portion has been determined substantially by the diffusion of a conductivity type determining impurity element characteristic of the one type into the semiconductor body at least over a surface part of the first portion.

In one such device the heterojunction is between a first portion of gallium arseno-phosphide containing a substantially uniform concentration of a donor element and a second portion of gallium arsenide of lower resistivity and containing a substantially uniform concentration of a donor element which is higher than the concentration of the donor element in the first portion, the change in donor concentration in the vicinity of the heterojunction from the first portion to the second portion being gradual, and the p-n junction nas been located in the second portion by the diffusion of an acceptor element into the semiconductor body at least over a surface part of the first portion. The first portion of gallium arseno-phosphide may be an epitaxial deposit on the second portion of gallium arsenide. The donor element in the first portion may be tin, the donor element in the second portion may be tin and the acceptor element may be zinc.

In another form of a photo-diode according to the first aspect of the invention, the heterojunction is between a first portion of a first material containing a substantially uniform concentration of a conductivity type determining impurity element characteristic of the opposite type and a second portion of a second material of lower energy gap than the material of the first portion and of higher resistivity containing a substantially uniform concentration of a conductivity type determining impurity element characteristic of the opposite type lower than the concentration of the conductivity type determining impurity element characteristic of the opposite type in the first portion, the concentration change in conductivity type determining impurity type characteristic of the opposite type in the vicinity of the heterojunction from the first portion to the second portion being gradual, and the location of the p-n junction spaced from the heterojunction in the first portion has been determined substantially by the diffusion of a conductivity type determining impurity element characteristic of the one type into the semiconductor body at least over a surface part of the first portion.

In one such device the heterojunction is between a first portion of gallium arseno-phosphide containing a substantially uniform concentration of a donor element and a second portion of gallium arsenide of higher resistivity and containing a substantially uniform concentration of a donor element which is lower than the concentration of the donor element in the first portion, the change in donor concentration in the vicinity of the heterojunction from the first portion to the second portion being gradual, and the p-n junction has been located in the second portion by the diffusion of an acceptor element into the semiconductor body at least over a surface part of the first portion. The first portion of gallium arseno-phosphide may be an epitaxial deposit on the second portion of gallium arsenide. The donor element in the first portion may be tin, the donor element in the second portion may be tin and the acceptor element may be zinc.

In a photo-electric semiconductor diode according to the invention the first portion may consist of a semiconductor material of higher energy gap than the material of the second portion such that the energy gap of the material of the first portion increases progressively from the heterojunction towards the surface of the first portion. Such a structure may be advantageously employed in a narrow band detector, in which the bandwidth of the spectral response can be modified by the applied voltage.

According to a second aspect of the invention in a method of manufacturing a photo-electric semiconductor diode comprising a semiconductor body having a heterojunction between a first portion of a first semiconductor material and a second portion of a second semiconductor material of lower energy gap than the first semiconductor material, a first region of the body of one conductivity type (p or n) lying predominantly within the first portion and a second region of the body of the opposite conductivity type (n or p) lying wholly within the second portion, initially the heterojunction is formed between a first portion consisting of the first material having a substantially uniform concentration of a conductivity type determining impurity element characteristic of the one type and a second portion consisting of the second material having a substantially uniform concentration of a conductivity type determining impurity element characteristic of the opposite type and lower than the concentration of the impurity element of the one type in the first portion and subsequently a heating step is performed to diffuse the conductivity type determining impurity element characteristic of the one type in the vicinity of the heterojunction from the first portion into the second portion to locate the p-n junction in the second portion spaced from the heterojunction.

The first portion may additionally contain a concentration of a conductivity type determining impurity element characteristic of the opposite type lower hatn the concentration of the impurity element of the one type and in equilibrium with the concentration of the impurity element of the opposite type in the second portion.

The heterojunction may be formed by epitaxial deposition of the material of the first portion on a substrate comprising the material of the second portion. Thus in one such method the epitaxially deposited material of the first portion is gallium arseno-phosphide containing a substantially uniform concentration of a donor element and the material of the second portion on which the deposition is made is gallium arsenide containing a substantially uniform concentration of an acceptor element and lower than the donor concentration in the first portion. The donor element may be tin and the acceptor element may be zinc.

Subsequent to the epitaxial deposition of the first portion and prior to the heating step a silicon oxide layer may be applied at least over the surface of the first portion in order to restrict out diffusion from the first portion during the subsequent heating step.

According to a third aspect of the invention in a method of manufacturing a photo-electric semiconductor diode comprising a semiconductor body having a heterojunction between a first portion of a first semiconductor material and a second portion of a second semiconductor material of lower energy gap than the first semiconductor material, a first region of the body of one conductivity type (p or n) lying predominantly within the first portion and a second region of the body of the opposite conductivity type (n or p) lying wholly within the second portion, initially the heterojunction is formed between a first portion of a high resistivity consisting of the first material having a substantially uniform concentration of a conductivity type determining impurity element characteristic of the opposite type and a second portion of low resistivity consisting of the second material having a substantially uniform concentration of a conductivity type determining impurity element characteristic of the opposite type higher than the concentration of the impurity element of the opposite type in the first portion with the simultaneous or subsequent formation of a gradual change in the concentration of conductivity type determining impurity element characteristic of the opposite type in the vicinity of the heterojunction, and the subsequent diffusion of a conductivity type determining impurity element characteristic of the one type at least into the surface of the first portion to locate the p-n junction in the second portion spaced from the heterojunction.

The heterojunction may be formed by the epitaxial deposition of the material of the first portion on a substrate comprising the material of the second portion.

The gradual change in concentration of the impurity element of the opposite type in the vicinity of the heterojunction is obtained by a heating step performed subsequent to the epitaxial deposition and prior to the diffusion of the element of the one type. Thus in one such method a first portion of n-type gallium arseno-phosphide is epitaxially deposited on a second portion of $n^+$-type gallium arsenide, a heating step is performed to redistribute the donor concentration in the vicinity of the heterojunction to form a gradual change in the donor concentration and thereafter an acceptor element is diffused at least into the surface of the epitaxially deposited gallium arseno-phosphide. The donor element in the first portion may be tin, the donor element in the second portion may be tin and the acceptor element may be zinc.

According to a fourth aspect of the invention in a method of manufacturing a photo-electric semiconductor diode comprising a semiconductor body having a heterojunction between a first portion of a first semiconductor material and a second portion of a second semiconductor material of lower energy gap than the first semiconductor material, a first region of the body of one conductivity type (p or n) lying predominantly within the first portion and a second region of the body of the opposite conductivity type (n or p) lying wholly within the second portion, initially the heterojunction is formed between a first portion of low resistivity consisting of the first material having a substantially uniform concentration of a conductivity type determining impurity element characteristic of the opposite type and a second portion of high resistivity consisting of the second material having a substantially uniform concentration of a conductivity type determining impurity element characteristic of the opposite type lower than the concentration of the impurity element of the opposite type in the first portion with the simultaneous or subsequent formation of a gradual change in the concentration of conductivity type determining impurity element characteristic of the opposite type in the vicinity of the heterojunction, and the subsequent diffusion of a conductivity type determining impurity element characteristic of the one type at least into the surface of the first portion to locate the p-n junction in the second portion spaced from the heterojunction.

In this method the heterojunction may be formed by the epitaxial deposition of the material of the first portion on a substrate comprising the material of the second portion and the gradual change in concentration of the impurity element of the opposite type in the vicinity of the heterojunction may be obtained by a heating step, performed subsequent to the epitaxial deposition and prior to the diffusion of the element of the one type. Thus in one such method a first portion of $n^+$-type gallium arseno-phosphide is epitaxially deposited on a second portion on n-type gallium arsenide, a heating step is performed to redistribute the donor concentration in the vicinity of the heterojunction to form a gradual change in the concentration and thereafter an acceptor element is diffused into the surface of the first and second portions at such a concentration as to locate the p-n junction in the second portion. The donor element in the first portion and/or the second portion may be tin and the acceptor element may be zinc.

The diffusion of the acceptor element must be controlled such that its final concentration in the first portion is less than that of the donor concentration and in the second portion beyond the p-n junction is always greater than the donor concentration therein.

In the methods according to the third and fourth aspects of the invention the gradual change in concentration of conductivity type determining impurity element characteristic of the opposite type in the vicinity of the heterojunction may be obtained simultaneously with the formation of the heterojunction, for example, when the second portion also consists of epitaxially deposited material by varying the concentration of the element during the final part of the deposition of the second portion and during the initial part of the deposition of the first portion.

Two embodiments of a photo-electric semiconductor diode according to the first aspect of the invention will now be described, by way of example, together with details of their methods of manufacture according to the second and third aspects of the invention respectively, with reference to the diagrammatic drawings accompanying the provisional specification, in which.

Figure 1:
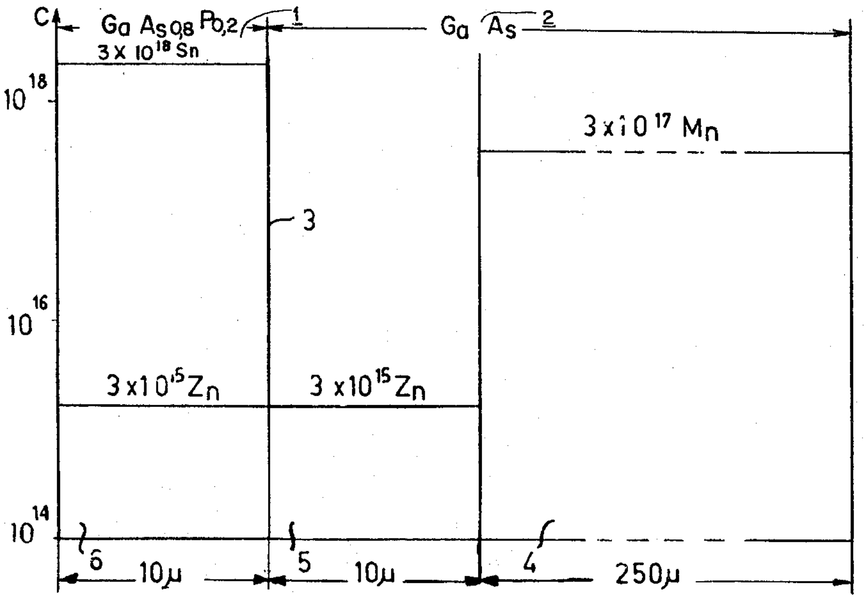
FIGURES 1 and 2 are graphs showing the concentration C of impurity centers in the semiconductor body of a first embodiment of a photo-diode during two stages of the manufacture thereof.
Figure 2:
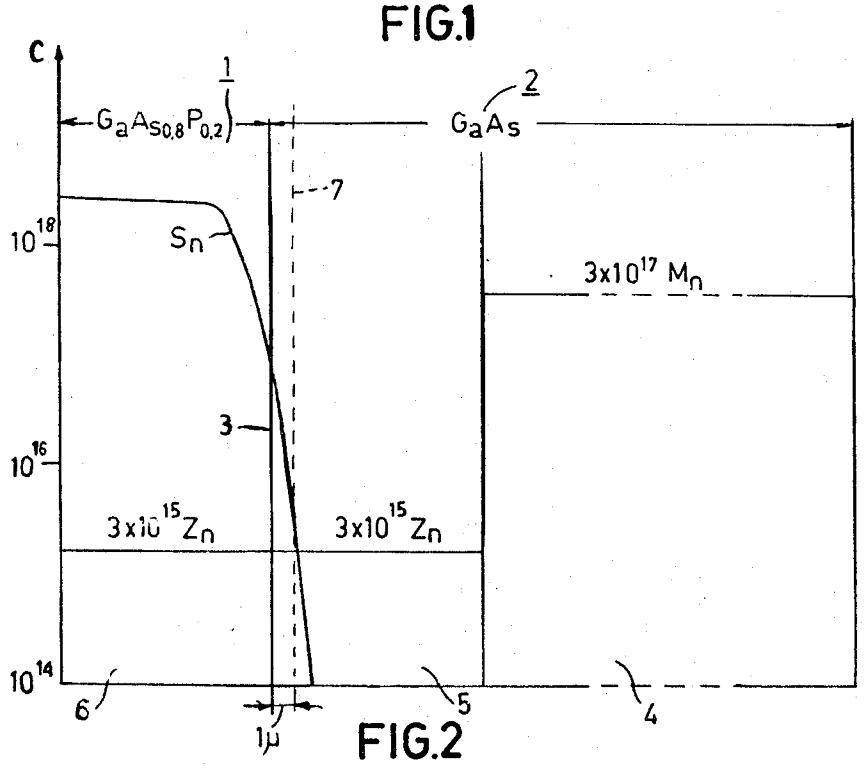

Referring first to FIGURES 1 and 2, the photo-diode comprises a semiconductor body having a first portion 1 of gallium arseno-phosphide of composition $GaAs_{0.8}P_{0.2}$ and a second portion 2 of gallium arsenide with a heterojunction 3 therebetween. The second portion of gallium arsenide consists of a low resistivity p-type substrate of 1 mm. x 1 mm. and 250 microns thickness containing $3 \times 10^{17}$ atoms/cc. of manganese on which there is a higher resistivity layer 5 of 10 microns thickness containing $3 \times 10^{15}$ atoms/cc. of zinc. The first portion consists of gallium arseno-phosphide epitaxially deposited on the higher resistivity epitaxially deposited gallium arsenide and containing an acceptor concentration of zinc which is in equilibrium with the acceptor concentration in the higher resistivity gallium arsenide and a donor concentration of tin, which is initially uniform (FIGURE 1) of $3 \times 10^{18}$ atoms/cc. In this case the acceptor concentration in the first portion of gallium arseno-phosphide in equilibrium with that in the layer 5 of gallium arsenide is of about the same amount but this will not necessarily always occur since the amount required for equilibrium depends upon the donor concentration in the first portion, and the temperature of subsequent treatment.

Figure 5:
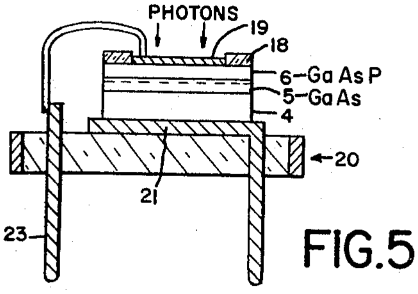
FIGURE 5 is a schematic side view of a header-mounted photodiode of the type illustrated in FIG. 2.

A p-n junction 7 is located in the gallium arsenide layer 5 and lies parallel to the heterojunction 3 and spaced therefrom by about 1 micron so that a first, n-type region of the body lies predominantly within the first portion 1 and a second, p-type region of the body lies wholly within the second portion 2. This location of the p-n junction 7 is achieved as is shown in FIGURE 2 by the diffusion of the donor tin in the vicinity of the heterojunction 3 from the first portion 1 into the second portion 2. The surface of the first portion of gallium arseno-phosphide has a layer of silicon oxide 18 thereon with an opening in the layer of silicon oxide containing a gold/tin ohmic contact 19 which has been alloyed to the n-type gallium arseno-phosphide. As shown in FIG. 5 the semiconductor body is mounted on a header 20 with the gallium arsenide substrate 4 soldered to the base 21 of the header and a gold connecting wire 22 between the gold/tin ohmic contact 19 and a post 23 on the header.

The photo-diode having the impurity concentrations shown in FIGURE 2 is manufactured as follows:

A body of low resistivity gallium arsenide having manganese as acceptor impurity in a concentration of about $3 \times 10^{17}$ atoms/cc. in the form of a slice 1 cm. x 1 cm. is lapped to a thickness of 250 microns to form the substrate 4 and polished so that it has a damage free crystal structure and an optically flat finish of one of its larger surfaces. A layer 5 of p-type gallium arsenide of 10 microns thickness is epitaxially grown on the prepared surface by deposition from the vapour phase. The gallium arsenide layer is formed at 750° C. by the reaction of gallium and arsenic, the gallium being produced by the disproportionation of gallium monochloride and the arsenic being produced by the reduction of arsenic trichloride with hydrogen. Simultaneous with the deposition of gallium arsenide zinc is deposited such that in the epitaxially grown layer there is a uniform concentration of zinc of $3 \times 10^{15}$ atoms/cc. Growth is continued until a layer 5 of 10 microns thickness is obtained.

A layer 6 of gallium arseno-phosphide of composition $GaAs_{0.8}P_{0.2}$ is epitaxially grown on the surface of the previously epitaxially grown gallium arsenide. The gallium arseno-phosphide layer is formed at 750° C. by the reaction of gallium with arsenic and phosphorous. The gallium and arsenic are obtained similarly as in the previous epitaxial deposition and the phosphorous is obtained by the reduction of phosphorous trichloride with hydrogen. Simultaneous with the deposition, tin and zinc are deposited such that in the epitaxially grown layer 6 there is a uniform concentration of tin of $3\times10^{18}$ atoms/cc. and a uniform concentration of zinc of $3\times10^{15}$ atoms/cc. The epitaxial growth is continued until a layer of 10 microns thickness has been obtained. At this stage the semiconductor body is of the form and has impurity concentrations as shown in FIGURE 1.

A silicon oxide layer is now grown on the surface of the body by the reaction of dry oxygen with tetraethyl silicate at a temperature of 350–450° C.

The body is then heated at approximately 1,000° C. for approximately 24 hours in order to diffuse the tin in the vicinity of the heterojunction from the gallium arseno-phosphide into the gallium arsenide such that the p-n junction lies in the gallium arsenide parallel to the heterojunction 3 and spaced therefrom by about 1 micron. The profile of this tin diffusion and eventual location of the p-n junction 7 is shown in FIGURE 2. The silicon oxide layer serves to restrict out diffusion of tin, zinc, phosphorous and arsenic during the heating step.

After this heating step a photosensitive resist layer is applied to the surface of the silicon oxide layer covering the epitaxially deposited gallium arseno-phosphide layer 6. With the aid of a mask the photosensitive resist is exposed such that a plurality of circular areas of 30 microns diameter with a mutual spacing of 1 mm. are shielded from the incident radiation. The unexposed parts of the resist layer are removed with a developer so that a plurality of openings are formed in the resist layer. Etching is then carried out to form openings in the silicon oxide layer below the openings in the resist layer and thus expose a plurality of areas on the surface of the gallium arseno-phosphide layer 6. The etchant used consists of a solution of 25% ammonium fluoride and 3% hydrofluoric acid in water.

Ohmic contact to the n-type gallium arseno-phosphide layer 6 exposed by the openings is made by evaporating gold containing 4% tin over the surface of the body comprising the silicon oxide layer and in which the openings are formed so that a gold 4% tin contact layer is deposited in each opening in the silicon oxide layer. The amount of gold/tin evaporated over the surface is such as to be insufficient to fill the openings and the filling is thereafter effected with a protective lacquer available commercially under the trade name "Cerric Resist." The remainder of the gold/tin layer on the upper surface of the body is removed with the exposed portion of the photosensitive resist layer, by softening the resist layer in trichlorethylene and rubbing. The protective lacquer of "Cerric Resist" in the openings above the gold/tin contact layers is removed by dissolving in acetone. The body is placed in a furnace and heated to 500° C. for five minutes to alloy the gold/tin contact layers to the underlying n-type gallium arseno-phosphide.

The body is then diced up into a plurality of individual photo-diode sub-assemblies at positions between the gold/tin contact areas so that each photo-diode sub-assembly consists of a smaller wafer of 1 mm. x 1 mm. having a gold/tin ohmic contact to the p-type gallium arseno-phosphide layer 6. The surface of the layer 6 has a silicon oxide layer thereon surrounding the contact.

The photo-diode sub-assembly is then mounted on a header by soldering the gallium arsenide substrate region 4 to the base of the header with a bismuth/silver alloy, thermo-compression bonding a gold wire onto the gold/tin contact and connecting the gold wire to a terminal post on the header followed by final encapsulation as is desired.

Figure 3:
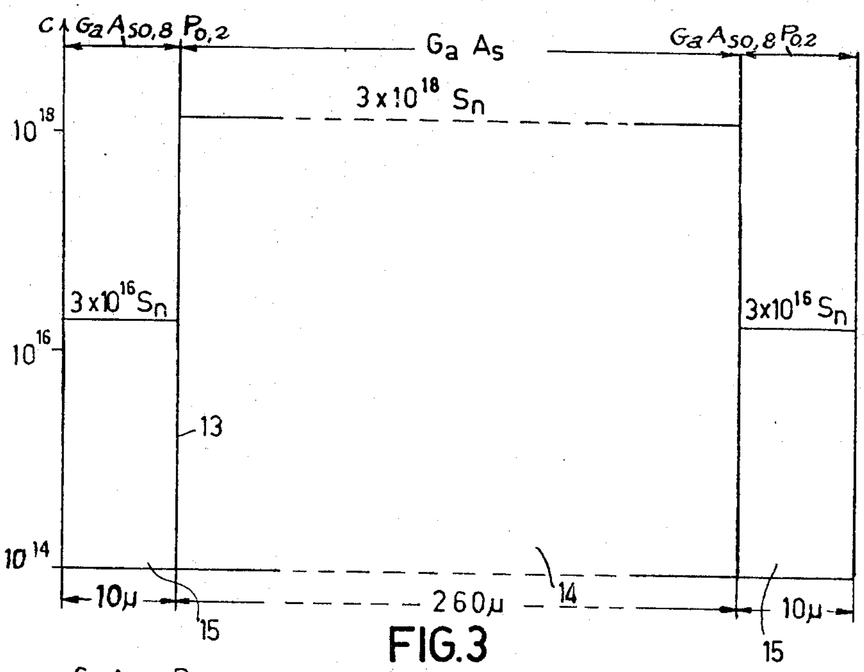
FIGURES 3 and 4 are graphs showing the concentration C of impurity centers in the semiconductor body of a second embodiment of a photo-diode during two stages of the manufacture thereof.
Figure 4:
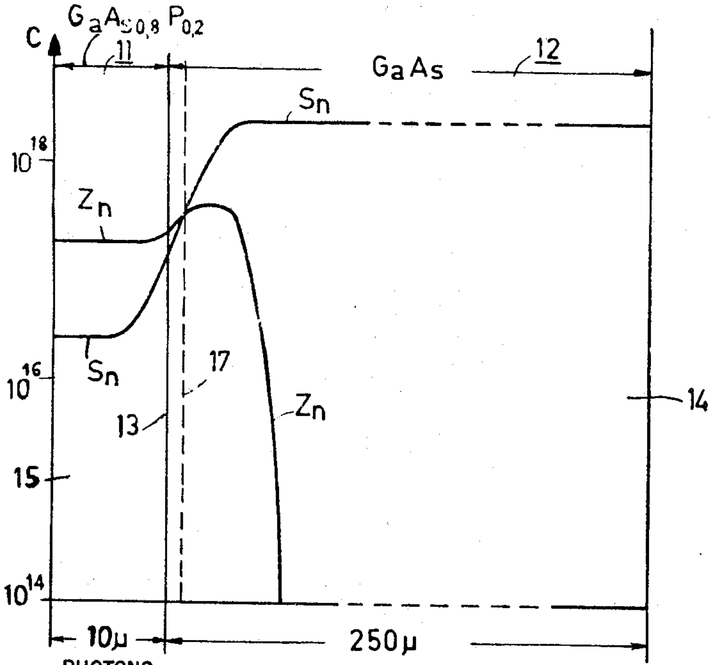

Referring now to FIGURE 4, the photo-diode comprises a semiconductor body having a first portion 11 of gallium arsenophosphide of composition $GaAs_{0.8}P_{0.2}$ and a second portion 12 of gallium arsenide with a heterojunction 13 therebetween. The second portion of gallium arsenide consists of a substrate 14 mainly of low resistivity material of 1 mm. x 1 mm. x 250 microns thickness, initially of 260 microns thickness and initially having a uniform donor concentration of tin of $3\times10^{18}$ atoms/cc. as is shown in FIGURE 3. The first portion consists mainly of a higher resistivity gallium arseno-phosphide layer 15 of 10 microns thickness epitaxially deposited on the gallium arsenide substrate 14 and initially containing a uniform donor concentration of tin of $3\times10^{16}$ atoms/cc. as is shown in FIGURE 3. A p-n junction 17 is located in the gallium arsenide substrate and lies parallel to the heterojunction 13 and spaced therefrom by about 1 micron so that a first, p-type region of the body containing the diffused acceptor zinc lies predominantly in the first portion 11 and a second, n-type region of the body lies wholly within the second portion 12. This location of the p-n junction is achieved as is shown in FIGURE 4 by the diffusion of the donor tin in the vicinity of the heterojunction 13 so that a gradual change in concentration is obtained, followed by the subsequent diffusion of zinc into the surface of the first portion of gallium arseno-phosphide.

The surface of the first portion of gallium arseno-phosphide has a layer of silicon oxide thereon with an opening in the layer of silicon oxide containing a gold/zinc ohmic contact which has been alloyed to the p-type gallium arseno-phosphide. The semiconductor body is mounted on a header with the gallium arsenide substrate 14 soldered to the base of the header and a gold connecting wire between the gold/zinc ohmic contact and a terminal post on the header.

The photodiode having the impurity concentrations shown in FIGURE 4 is manufactured as follows:

A body of low resistivity n-type gallium arsenide having tin as donor impurity in a concentration of about $3\times10^{18}$ atoms/cc. in the form of a slice 1 cm. x 1 cm. is lapped to a thickness of about 260 microns so that it has a damage free crystal structure and an optically flat finish on its larger opposite surfaces. A layer of higher resistivity n-type gallium arsenide of 10 microns thickness is epitaxially grown on the body by deposition from the vapour phase. The epitaxial deposition is carried out in a similar manner as described with reference to the manufacture of the photo-diode of FIGURE 2 except that simultaneous with the epitaxial deposition tin is deposited such that in the epitaxially grown layer there is a uniform concentration of tin of $3\times10^{16}$ atoms/cc. and furthermore the epitaxial growth is over the whole body. At this stage a semiconductor body having the impurity concentrations shown in FIGURE 3 is obtained.

The semiconductor body is then placed in a tube containing powdered gallium arseno-phosphide which is doped with tin in a concentration of $3\times10^{16}$ atoms/cc. The tube is sealed and heated at 1,000° C. for 24 hours. The powdered tin doped gallium arseno-phosphide serves to limit the decomposition of the semiconductor body and the outdiffusion of tin therefrom. During this heating step a redistribution of the tin concentration in the vicinity of the heretojunction occurs so that the concentration change is gradual. The semiconductor body is removed from the tube and placed in a further tube containing zinc and powdered gallium arseno-phosphide. The tube is sealed and heated at 900° C. for 12 hours to diffuse the zinc into the semiconductor body such that the p-n junction is located in the gallium arsenide substrate 14 parallel to and spaced from the heterojunction 13 by about 1 micron. After the zinc diffusion the semiconductor body is removed from the tube and one of the larger surfaces has about 20 microns of material removed by grinding. This results in a semiconductor body having impurity concentrations as shown in FIGURE 4.

A silicon oxide layer is grown on the remaining surface of the gallium arseno-phosphide layer 15 by the reaction of dry oxygen with tetraethyl silicate at a temperature of 350–450° C., the opposite surface of the body being suitably masked.

A photosensitive resist layer is applied to the surface of the silicon oxide layer covering the epitaxially deposited gallium arseno-phosphide layer 15. With the aid of a mask the photosensitive resist is exposed such that a plurality of circular areas of 30 microns diameter with a mutual spacing of 1 mm. are shielded from the incident radiation. The unexposed parts of the resist layer are removed with a developer so that a plurality of openings are formed in the resist layer. Etching is then carried out to form openings in the silicon oxide layer below the openings in the resist layer and thus exposed a plurality of areas on the surface of the gallium arseno-phosphide layer 15. The etchant used consists of a solution of 25% ammonium fluoride and 3% hydrofluoric acid in water Ohmic contact to the p-type gallium arseno-phosphide layer 15 exposed by the openings is made by evaporating gold containing 4% zinc over the surface of the body comprising the silicon oxide layer and in which the openings are formed so that a gold 4% zinc contact layer is deposited in each opening in the silicon oxide layer. The amount of gold/zinc evaporated over the surface is such as to be insufficient to fill the openings and the filling is thereafter effected with a protective lacquer of "Cerric Resist." The remainder of the gold/zinc layer on the upper surface of the body is removed with the exposed portion of the photosensitive resist layer, by softening the resist layer in trichlorethylene and rubbing. The protective lacquer of "Cerric Resist" in the openings above the gold/zinc contact layers is removed by dissolving in acetone. The body is placed in a furnace and heated to 500° C. for five minutes to alloy the gold/zinc contact layers to the underlying p-type gallium arseno-phosphide.

The body is then diced up into a plurality of individual photo-diode sub-assemblies at positions between the gold/zinc contact areas so that each photo-diode sub-assembly consists of a smaller wafer 1 mm. x 1 mm. having a gold/zinc ohmic contact to the p-type gallium arseno-phosphide layer 15. The surface of the layer 15 has a silicon oxide layer thereon surrounding the contact.

The photo-diode sub-assembly is then mounted on a header by soldering the gallium arsenide substrate region 14 to the base of the header with tin, thermo-compression bonding a gold wire onto the gold/zinc contact and connecting the gold wire to a terminal post on the header followed by final encapsulation as is desired.

Both the embodiments of a photo-diode according to the invention comprise a silicon oxide layer on the surface of the epitaxially deposited gallium arseno-phosphide layer which is provided primarily to facilitate various steps in the manufacture. The silicon oxide layer may be removed if desired.

What is claimed is:

1. A photo-responsive semiconductor diode comprising a semiconductor body having a first region of one type conductivity contiguous with a second region of the opposite type conductivity to form at their junction a p-n junction, said semiconductor body having at least two contiguous portions of semiconductor material of different composition possessing different optical energy gaps and including a first material portion of high energy gap and a second material portion of energy gap lower than that of said first material portion forming a heterojunction at their boundary, the second region lying wholly within the second portion of lower energy gap, the first region lying predominantly in the first portion of higher energy gap but extending into the second portion such that the p-n junction lies wholly within the second portion of lower energy gap and spaced from the boundary heterojunction of the first and second portions, whereby the depletion field extending from the p-n junction is located predominantly in the second portion of lower energy gap, and means supporting said body to receive the photons to be detected on a surface of the first material portion of higher energy gap exhibiting a relatively long absorption length for said photons.

2. A photo-responsive semiconductor diode as set forth in claim 1 wherein the spacing between the p-n junction and the said boundary is at least one micron.

3. A photo-responsive semiconductor diode as set forth in claim 1 wherein the second portion of lower energy gap has a resistivity such that with a reverse biasing voltage applied across the p-n junction the width of the depletion field formed at the p-n junction is between about 3 and 5 times the absorption length of the photons in the material of the second portion for the principal photons of maximum energy detected.

4. A photo-responsive semiconductor diode as set forth in claim 1 wherein both the first and second semiconductor portions are a III–V semiconductor compound or a substituted III–V semiconductor compound.

5. A photo-responsive semiconductor diode as set forth in claim 1 wherein the second region of opposite type conductivity contains a substantially uniform concentration of an opposite type conductivity determining impurity element, and most of the first region up to the vicinity of the p-n junction contains a substantially uniform concentration of a one type conductivity determining impurity element which latter concentration is higher than that present in the said region of the opposite type impurity, the concentration of the one type impurity declining in the direction toward and in the vicinity of the p-n junction.

6. A photo-responsive semiconductor diode as set forth in claim 5 wherein the first portion is of donor-doped $GaAs_{1-x}P_x$ and the second portion is of acceptor-doped GaAs.

7. A photo-responsive semiconductor device as set forth in claim 1 wherein the second region of opposite type conductivity contains a substantially uniform concentration of an opposite type conductivity determining impurity element and the first region remote from the p-n junction contains a substantially uniform concentration of said opposite type impurity which is lower than that in said second region with the said concentration increasing gradually toward the latter, and the said first region also contains a concentration of a one type conductivity determining impurity element which is higher than that of the opposite type impurity element up until the p-n junction.

8. A photo-responsive semiconductor as set forth in claim 7 wherein the first portion is of donor and acceptor doped $GaAs_{1-x}P_x$ and the second portion is of principally donor-doped GaAs.

References Cited

UNITED STATES PATENTS

| | | | |
|---|---|---|---|
| 2,629,800 | 2/1953 | Pearson | 201—63 |
| 3,229,104 | 1/1966 | Rutz | 250—211 |
| 3,163,562 | 12/1964 | Ross | 148—33.4 |
| 3,273,030 | 9/1966 | Balk et al. | 317—235 |
| 3,249,473 | 5/1966 | Holonyak | 148—175 |

JOHN W. HUCKERT, Primary Examiner

M. H. EDLOW, Assistant Examiner

U.S. Cl. X.R.

250—211; 313—108; 317—234